United States Patent [19]
Machida et al.

[11] Patent Number: 6,140,711
[45] Date of Patent: Oct. 31, 2000

[54] ALIGNMENT MARKS OF SEMICONDUCTOR SUBSTRATE AND MANUFACTURING METHOD THEREOF

[75] Inventors: Satoshi Machida; Akiyuki Minami, both of Tokyo, Japan

[73] Assignee: Oki Electric Industry Co., Ltd., Tokyo, Japan

[21] Appl. No.: 09/108,969

[22] Filed: Jul. 2, 1998

[30] Foreign Application Priority Data

Jul. 25, 1997 [JP] Japan ..................... 9-215667

[51] Int. Cl.⁷ .................................. H01L 23/544
[52] U.S. Cl. .................. 257/797; 257/308; 438/254; 438/401
[58] Field of Search ................. 257/797, 308; 438/254, 401

[56] References Cited

U.S. PATENT DOCUMENTS

| | | | |
|---|---|---|---|
| 5,523,254 | 6/1996 | Satoh et al. | 437/62 |
| 5,811,331 | 9/1998 | Ying et al. | 438/253 |
| 5,856,220 | 1/1999 | Wang et al. | 438/254 |
| 5,869,383 | 2/1999 | Chien et al. | 438/401 |
| 5,877,064 | 3/1999 | Chang et al. | 438/401 |
| 5,889,335 | 4/1999 | Kuroi et al. | 257/797 |
| 5,915,189 | 6/1999 | Sim | 438/397 |

*Primary Examiner*—Matthew Smith
*Assistant Examiner*—Granvill D Lee
*Attorney, Agent, or Firm*—Jones Volentine, LLC

[57] ABSTRACT

An alignment mark which is employed for the alignment of a semiconductor substrate during a lithography process in the production of a semiconductor element, includes a trough-like pattern having a width roughly equal to the width of a circuit element provided at the surface of the semiconductor substrate. Since the width of the trough-like pattern is set roughly equal to that of the circuit element, a secure trough-like pattern that will not be removed to an excessive degree during processes such as etch-back is formed at the surface of the semiconductor substrate, even if the alignment mark is formed concurrently with the formation of the circuit element. Consequently, a clear alignment mark that can be produced concurrently with the formation of a circuit element of the semiconductor circuit element and that presents no risk of collapsing or separating, is provided.

11 Claims, 11 Drawing Sheets

ALIGNMENT MARKS OF SEMICONDUCTOR SUBSTRATE AND MANUFACTURING METHOD THEREOF

FIELD OF THE INVENTION

1. Background of the Invention

The present invention relates to alignment marks of a semiconductor substrate employed for alignment during production of semiconductor elements such as semiconductor integrated circuits (hereafter referred to as LSI) and a method for manufacturing them.

2. Description of the Related Art

During the lithography process in the production of semiconductor elements such as LSIs, a transfer method is which a circuit pattern is transferred onto a semiconductor substrate at full scale or scaled down to an appropriate degree by using a mask constituted of a transparent base in which a desired circuit pattern is formed using a material such as chrome that has a light blocking property against the exposure light of the optical system, is implemented. During this transfer step, a reflection or a projection optical system is employed to form an image of the pattern of the mask on a photosensitive high polymer, which is referred to as a resist, on the semiconductor substrate and by exposing and imprinting the resist, the desired circuit pattern is transferred onto the semiconductor substrate.

During the process of exposing the resist, it is necessary to align the mask and the semiconductor substrate with an extremely high degree of accuracy. If their alignment is inaccurate, the various circuit elements constituting the LSI will not be provided at specific positions on the surface of the semiconductor substrate. Normally, this alignment is achieved by using alignment marks formed on the mask and alignment marks formed on the surface of the semiconductor substrate. In other words, the positional relationship between the alignment marks on the mask and the alignment marks on the semiconductor substrate surface is measured and ascertained by an alignment mechanism at an exposure device so that the alignment marks can be matched to achieve alignment.

Figure 4A:
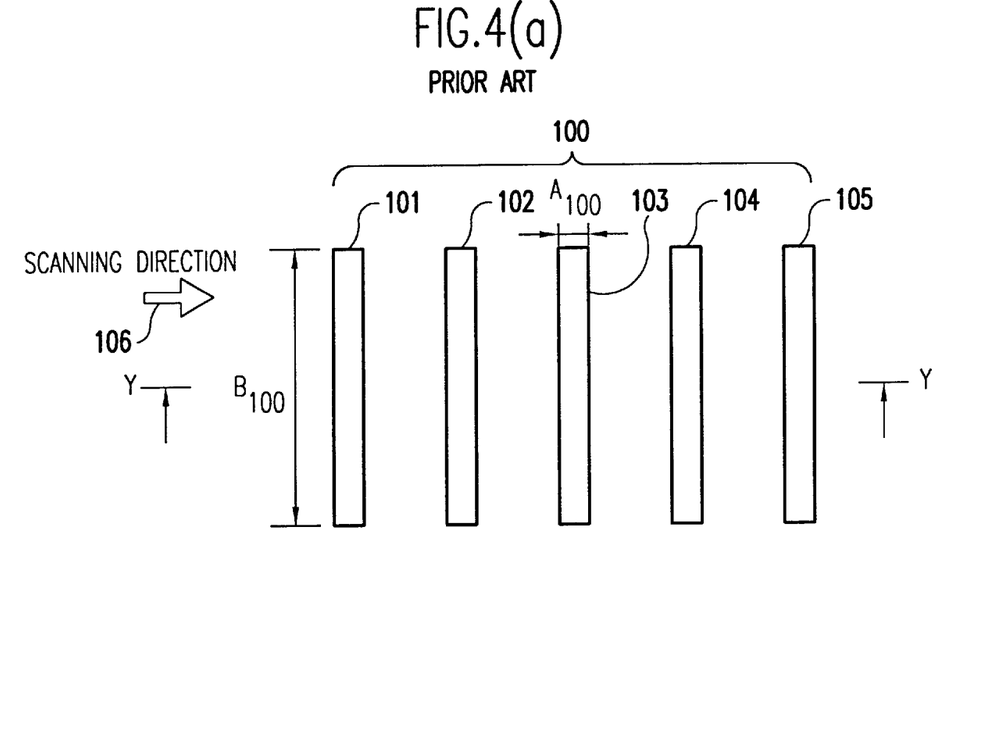
Figure 4B:
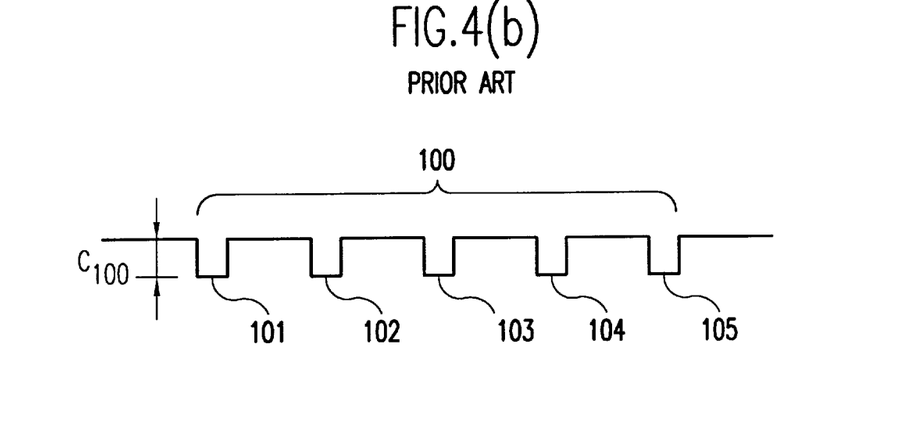

Various forms of alignment marks that may be formed on the surface of a semiconductor substrate have been designed and put into practical use in correspondence to various types of means for detection. FIG. 4 shows an example of alignment marks in the prior art, with FIG. 4(a) presenting a basic plan view and FIG. 4(b) presenting a basic cross section of the alignment mark. The alignment mark 100 in the figure is constituted by providing slit patterns 101–105 constituted of longitudinal indentations over specific intervals at an insulating film or the like at the surface of a semiconductor substrate. As indicated with the arrow 106 in FIG. 4, the alignment mark is optically scanned to intersect all of the five slit patterns 101–105 to detect a signal, and the location at which the third slit pattern 103 is detected, for instance, is identified as the central position.

The width $A_{100}$ of the individual slit patterns 101–105 employed in the conventional alignment mark 100 in the prior art may be set at varying values in correspondence to the purpose of use, the type of film constituting the insulating film, its film thickness and the like, but the width $A_{100}$ is never less than 1 micro-meter and normally, is approximately several micro-meter. In addition, the length $B_{100}$ of the individual slit patterns 101–105 is set at approximately 10 micro-meter or more in order to facilitate the scanning, whereas the depth $C_{100}$ is set at approximately 0.1–5 micro-meter, approximately equaling the thickness of the insulating film, as illustrated in FIG. 4(b). It is to be noted that if the alignment mark 100 is to be detected via an opaque film constituted of tungsten, for instance, a width which is equal to or more than twice the film thickness is required.

Now, the following two methods may be adopted to produce this alignment mark 100.

In the first method, the individual slit patterns 101–105 constituting the alignment mark 100 are produced through a separate process independent of the process in which the various circuit elements of the semiconductor element are produced. However, this method will necessitate an increase in the overall number of manufacturing steps because of the separate process in which the alignment mark 100 is produced which will lead to a longer time required for manufacturing the semiconductor element and an increase in production cost.

In the other method, the individual slit patterns 101–105 constituting the alignment mark 100 are produced concurrently during the process in which the various circuit elements of the semiconductor element are produced. By adopting this method, in which it is not necessary to implement a separate process for producing the alignment mark 100, the overall-number of steps can be reduced to achieve a reduction in the length of manufacturing time and a reduction in the production cost, compared to the method described above, in which the alignment mark 100 is produced through a separate process.

However, when the latter method is employed, the slit patterns 101–105 may not be produced successfully, depending upon how the manufacturing process of the circuit element of the LSI is implemented. Now, a specific explanation is given on the formation of a cylindrical storage node 110, which is an example of a circuit element, at the surface of a semiconductor substrate 111 by referring to FIGS. 5(a)–(g) and FIGS. 5(a')–(g'). It is to be noted that FIGS. 5(a)–(g) are rough cross sections illustrating the steps for producing the storage node 110, where as FIGS. 5(a')–(g') are rough cross sections illustrating the steps for producing the slit patterns 101–105 of the alignment mark 100 that are produced concurrently with the formation of the storage node 110.

Figure 5:
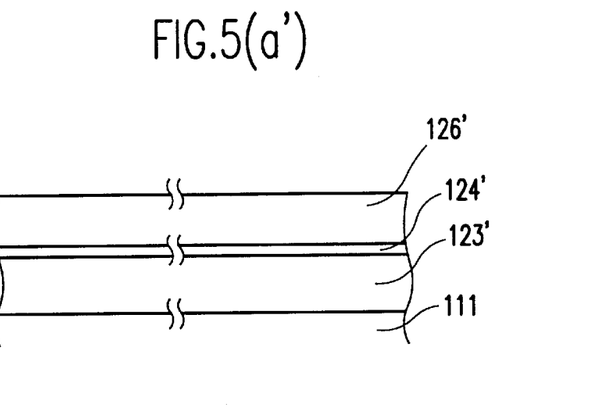

The storage node 110 in this example refers to a charge storage electrode (hereinafter referred to as a storage node), one of the circuit elements constituting a dynamic random access memory (DRAM), which is a type of LSI. The storage node 110 may assume various forms and may adopt various methods, and in FIG. 5, a cylindrical (cylindrical) storage node 110 is illustrated as an example. In addition, since the individual slit patterns 101–105 have structures that are identical to one another, the slit pattern 101 in the alignment mark 100 is illustrated as a typical example.

Figure 5A:
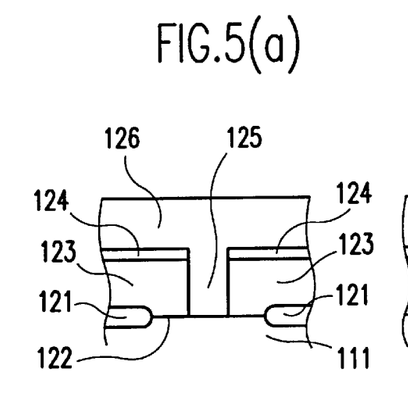

At the location where the storage node 110 is to be produced at the surface of the semiconductor substrate (silicon wafer) 111, a first insulating film 123 constituted of, for instance, silicon oxide and an etching block film 124 constituted of, for instance, silicon nitride are provided in advance in an active element area 122 partitioned by element separating areas 121, with a contact hole 125 passing through the insulating film 123 and the etching block film 124, as illustrated in FIG. 5(a). The contact hole 125 is filled with a second insulating film 126 constituted of, for instance, silicon oxide, and the insulating film 123 and the etching block film 124, too, are covered by the second insulating film 126.

In addition, at the location where the alignment mark 100 is to be produced at the surface of the semiconductor substrate 111, too, a first insulating film 123', an etching block film 124' and a second insulating film 126' are sequentially laminated in advance, as illustrated in FIG. 5(a'). These films, i.e., the first insulating film 123', the etching block film 124' and the second insulating film 126' are respectively constituted of the same materials as those constituting the first insulating film 123, the etching block film 124 and the second insulating film 126 illustrated in FIG. 5(a), and they are all formed through one and the same process.

Figure 5B:
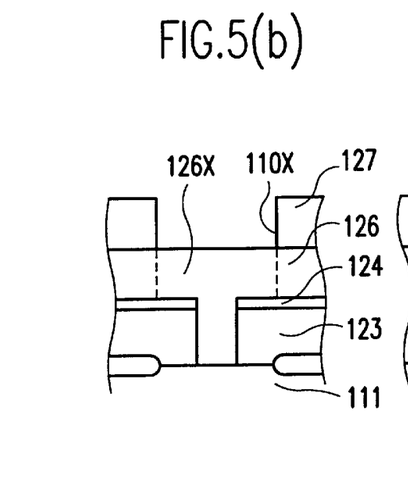

Then, the second insulating films 126 and 126' are first removed to achieve desired patterns through etching. Namely, as illustrated in FIG. 5(b), at the location where the storage node 110 is to be produced, a pattern 110x of the storage node 110 is transferred onto a resist 127 provided at the surface of the second insulating film 126 and developed, which this is then used as an etching mask to perform an isotropic etching on the second insulating film 126 in the vertical direction to remove the second insulating film 126 from an element area 126x that includes the area within the contact hole 125 indicated with the broken lines in FIG. 5(b). The width $A_{110}$ of the element area 126x is, at most, approximately 0.5 micro-meter, in the case of a circuit element such a storage node in a 256 megabit DRAM, for instance.

In addition, as illustrated in FIG. 5(b'), concurrently with the process described above, at the location where the alignment mark 100 is to be produced, too, a pattern 101x of the slit pattern 101 is transferred onto a resist 127' provided at the surface of the second insulating film 126' and is developed, which is then used as an etching mask to perform an isotropic etching on the second insulating film 126' in the vertical direction to remove the second insulating film 126' from a slit area 126x' indicated with the broken lines in FIG. 5(b'). The width $A_{100}$ of this slit area 126x' is only approximately a few micro-meter under normal circumstances, as has been explained earlier in reference to FIG. 4. It is to be noted that since the etching block films 124 and 124' are present at the locations where the storage mode 110 is to be produced and where the alignment mark 100 is to be produced, the first insulating films 123 and 123' are not etched.

Figure 5C:
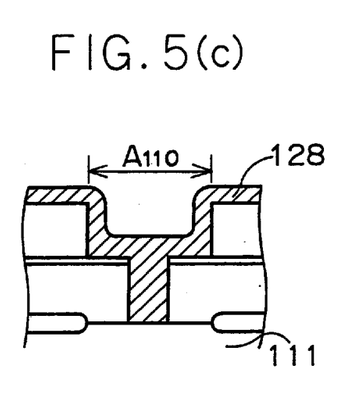

Next, a polysilicon film is formed over the entire surface of the semiconductor substrate. Namely, at the location where the storage node 110 is to be produced, a polysilicon film 128 which is to constitute the storage node is formed over the entire surface as illustrated in FIG. 5(c). At the same time, at the location where the alignment mark 100 is to be produced, too, a polysilicon film 128' is formed as illustrated in FIG. 5(c').

Figure 5D:
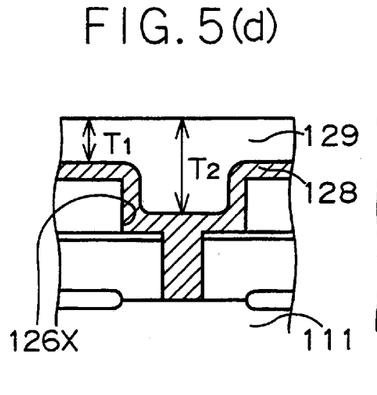

Then, a third insulating film is formed over the entire surface of the semiconductor substrate 3. Namely, as illustrated in FIG. 5(d), at the location where the storage node 110 is to be produced, a third insulating film 129 constituted of silicon oxide or the like is formed on the polysilicon film 128. Since the width $A_{110}$ of the element area 126x is extremely small, at approximately 0.5 micro-meter at the most, at the location where the storage node 110 is to be produced, the surface of the third insulating film 129 forms an almost level surface with the thickness $T_2$ of the third insulating film 129 at the element area 126x and the thickness $T_1$ of the insulating film 129 on the polysilicon film 128 in the other areas satisfying the relationship express as: $T_1 < T_2$.

At the same time, as illustrated in FIG. 5(d') at the location where the alignment mark 100 is to be produced, too, a third insulating film 129' is formed on the polysilicon film 128'. In this case, since the width $A_{100}$ of the slit area 126x' is relatively large at several micro-meter, as described earlier, the surface of the polysilicon film 128' is recessed in conformance with the shape of the slit area 126x' at the location where the alignment mark 100 is to be produced. Thus, the thickness $T_2'$ of the third insulating film 129' in the vicinity of the centers of the slit areas 126x' and the thickness $T_1'$ of the insulating film 129' on the polysilicon film 128' in the other are as satisfy a relationship which is roughly expressed as $T_1' = T_2'$.

Figure 5E:
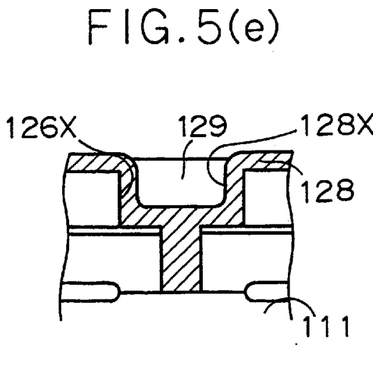

Next, the third insulating films are etched back. Namely, at the location where the storage node 110 is to be produced, the entire surface of the third insulating film 129 is etched back so that the surface of the polysilicon film 128 is exposed, as illustrated in FIG. 5(e). Thus, since the thickness $T_2$ of the third insulating film 129 at the element area 126x and the thickness $T_1$ of the insulating film 129 on the polysilicon film 128 in the other areas satisfy $T_1 < T_2$ at the location where the storage node 110 is to be produced, the third insulating film 129 will remain in an indented portion 128x formed at the polysilicon film 128 that corresponds to the element area 126x.

At the same time, at the location where the alignment mark 100 is to be produced, too, the entire surface of the third insulating film 129' is etched back. In this case, since the thickness $T_2'$ of the third insulating film 129' in the vicinity of the centers of the slit areas 126x' and the thickness $T_1'$ of the insulating film 129' on the polysilicon film 128' in the other areas are approximately equal to each other at the location where the alignment mark 100 is to be produced, hardly any third insulating film 129' remains at an indented portion 128x' formed at the polysilicon film 128' that corresponds to the slit area 126x', so that the surface of the polysilicon film 128' is almost exposed even within the indented portion 128x', as illustrated in FIG. 5(e').

Figure 5F:
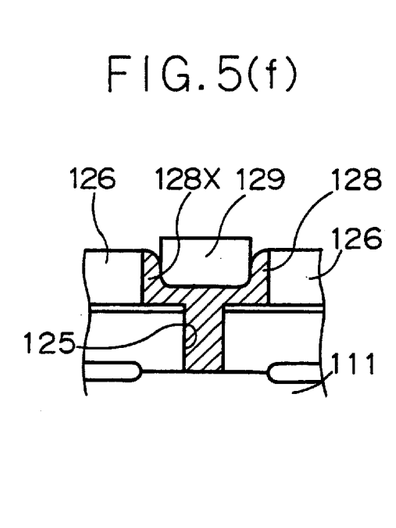

Next, the polysilicon films are etched back. Namely, as illustrated in FIG. 5(f), at the location where the storage node 110 is to be produced, since the third insulating film 129 is still present, the polysilicon film 128 is not removed and remains in the area that includes the indented portion 128x and the area within the contact hole 125 even after the polysilicon film 128 is etched back. At the same time, the polysilicon film 128' is etched back at the location where the alignment mark 100 is to be produced, and in this case, since almost no third insulating film 129' remains at the indented portion 128x', almost the entire polysilicon film 128' is removed, including the polysilicon film 128' at the indented portion 128x', as illustrated in FIG. 5(f').

Figure 5G:
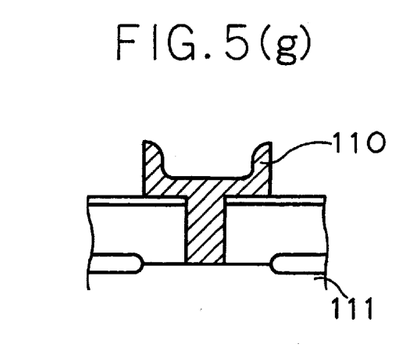

Then, the third insulating films and the second insulating films are removed by using hydrofluoric acid or the like. Namely, as illustrated in FIG. 5(g), by removing the third insulating film 129 and the second insulating film 126 remaining at the indented portion 128x, a cylindrical storage node 110 constituted of polysilicon can be formed at the location where the storage node 110 is to be produced. At the same time, as illustrated in FIG. 5(g'), at the location where the alignment mark 100 is to be produced, too, the third insulating film 129' and the second insulating film 126' are removed. However, in this case, since almost no third insulating film 129' is left at the indented portion 128x', very little of the polysilicon film 128' remains at the indented portion 128x' as illustrated in FIG. 5(f).

When the alignment mark is produced concurrently during the process in which the various circuit elements of a semiconductor element are manufactured in this manner, only the slit pattern 101 in a linear form having an extremely small width remains at the surface of the semiconductor substrate 111 as explained in reference to FIG. 5(g'), and consequently, a clear alignment mark 100 cannot be produced. In addition, the width W of the contact surfaces where the individual slit patterns 101–105 of the alignment mark 100 thus produced come in contact with the semiconductor substrate 111 (the etching block film 124' in this example) is extremely small at approximately 0.2–0.1 micro-meter. At such a small contact width, problems such as the individual slit patterns 101–105 of the alignment mark 100 becoming collapsed or separated may occur during the subsequent substrate washing process or the like. If such a problem occurs, the function of the alignment mark 100 will not be fulfilled, and furthermore, broken pieces of the individual slit patterns 101–105 that have become separated may become dispersed in the circuit area of the LSI, to cause a fatal defect such as shoring of the circuit.

SUMMARY OF THE INVENTION

An object of the present invention, which has been completed by addressing the problems of the alignment mark and its manufacturing method in the prior art described above, is to provide a new and improved alignment mark that can be produced concurrently during the process in which various circuit elements of a semiconductor element are manufactured to achieve a reduction in the overall number of steps for manufacturing the semiconductor element and a method for manufacturing this alignment mark.

Another object of the present invention is to provide a new and improved alignment mark formed in a distinct shape to improve the accuracy of the alignment process, which also eliminates any risk of collapse or separation and a method for producing this alignment mark.

In order to achieve the objects described above, the alignment mark in a first aspect of the present invention, which is used for alignment of a semiconductor substrate during the lithography process implemented as a step in manufacturing a semiconductor element, is characterized in that it is constituted of trough-like patterns having a width which is approximately equal to the width of a circuit element provided at the surface of the semiconductor substrate.

The alignment mark, in which the width of the trough-like patterns is set roughly equal to the width of the circuit element provided at the surface of the semiconductor substrate, makes it possible to form secure trough-like patterns at the surface of the semiconductor substrate without removing the trough-like patterns to an excessive degree during the process of etching back, to achieve an alignment mark that is distinct and does not present any risk of collapse or separation. It is to be noted that "a width roughly equal to that of a circuit element" as phrased in reference to the present invention does not require the width of the circuit elements and the width of the trough-like patterns to be exactly the same and only requires a width within a range over which trough-like patterns can be formed without removing them to an excessive degree even when the etch-back process and the like for forming the circuit elements is implemented at the same time.

It is to be noted that a circuit element having a width that is roughly equal to the width of the alignment mark may be, for instance, a storage node. In this case, if the storage node is formed in a cylindrical shape, the width of the trough-like patterns should be set roughly equal to the external diameter of the cylindrical storage node. In addition, it is desirable that the trough-like patterns be constituted of the same material as that constituting the storage node, since this will make it possible to manufacture the circuit element and the trough-like patterns under the same conditions. Furthermore, its is desirable to provide a supporting portion embedded in an insulating film at the surface of the semiconductor substrate in order to endure that the trough-like patterns are mounted securely at the surface of the semiconductor substrate. This will make it possible to provide an alignment mark with even less risk of collapse or separation.

In addition, in a second aspect of the present invention, when producing a circuit element by implementing a step in which a resist film is formed at a surface of a semiconductor substrate, a step in which a film constituted of a circuit element material is formed and a step in which the circuit element material is etched to achieve a desired shape, steps that are identical to these steps are implemented concurrently to form trough-like patterns having a width roughly equal to that of the circuit element at the surface of the semiconductor substrate.

By adopting such a method for manufacturing an alignment mark, it becomes possible to produce the alignment mark concurrently during the process in which various circuit elements of a semiconductor element are manufactured to achieve a reduction in the overall number of manufacturing steps compared to a method in which the alignment mark is produced through a separate process to ultimately reduce the length of manufacturing time and to reduce the production cost. It is to be noted that the circuit element that is manufactured concurrently during the production of the alignment mark may be, for instance, a cylindrical storage node.

BRIEF DESCRIPTION OF THE DRAWINGS

The above and other features of the invention and the concomitant advantages will be better understood and appreciated by persons skilled in the filed to which the invention pertains in view of the following description given in conjunction with the accompanying drawings which illustrate preferred embodiments.

FIGS. 1(a)–(g) and FIGS. 1(a')–(g') illustrate individual steps in which the alignment mark in a first embodiment of the present invention is produced through the same process as that for manufacturing the storage node;

FIG. 2 presents the individual patterns adopted in the first embodiment of the present invention, with FIG. 2(a) presenting a plan view of the patterns and FIG. 2(b) presenting a cross section through Y—Y viewed in the direction of the arrows in FIG. 2(a);

FIGS. 3(a)–(g) and FIGS. 3(a')–(g') illustrate individual steps in which the alignment mark in a second embodiment of the present invention is produced through the same process as that for manufacturing the storage node;

FIG. 4 illustrates an alignment mark in the prior art, with FIG. 4(a) presenting its plan view and FIG. 4(b) presenting a cross section through Y—Y viewed in the direction of the arrows in FIG. 4(a); and FIGS. 5(a)–(g) and FIGS. 5(a')–(g') illustrated problems occurring when the alignment mark in the prior art is produced through the same process as that for manufacturing the storage node.

DETAILED DESCRIPTION OF THE PREFERRED EMBODIMENTS

The following is a detailed explanation of the alignment mark and the method for manufacturing the alignment mark in preferred embodiments of the present invention in reference to the attached drawings. It is to be noted that the same reference numbers are assigned to components having approximately the same functions and structural features in the following explanation and the attached drawings to preclude the necessity for repeated explanation thereof.

Figure 1:
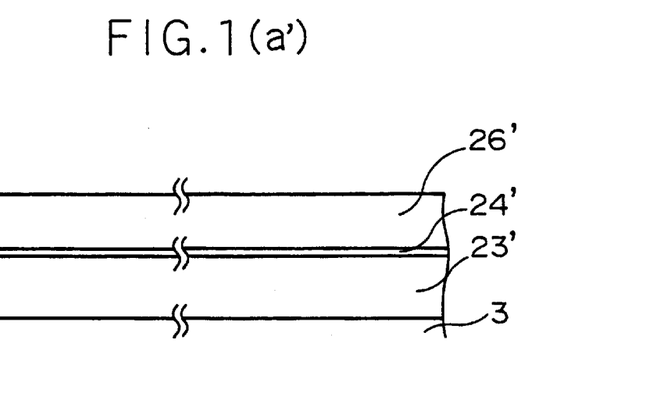
Figure 1A:
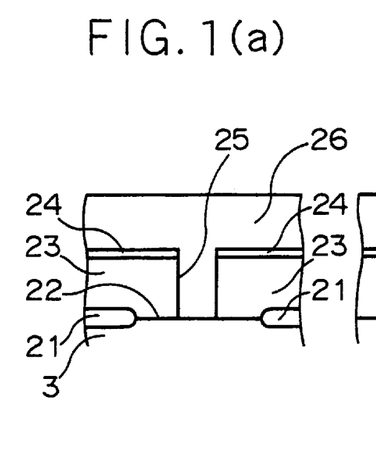
Figure 1B:
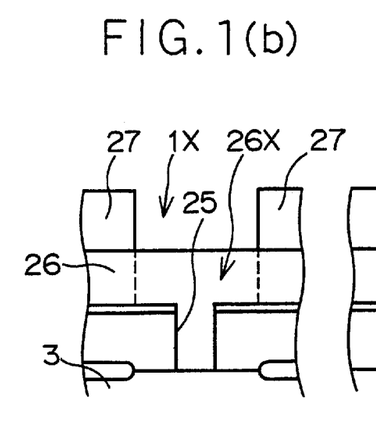
Figure 1C:
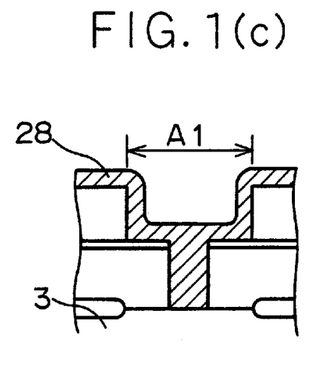
Figure 1D:
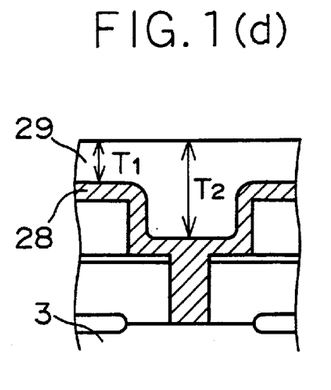
Figure 1E:
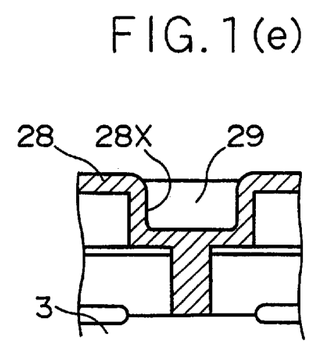
Figure 1F:
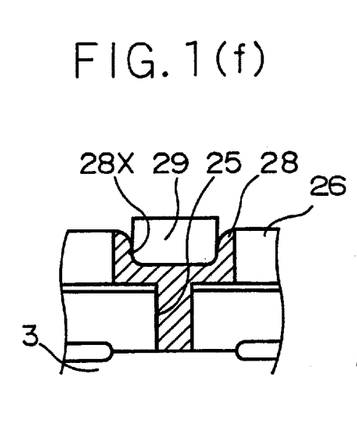
Figure 1G:
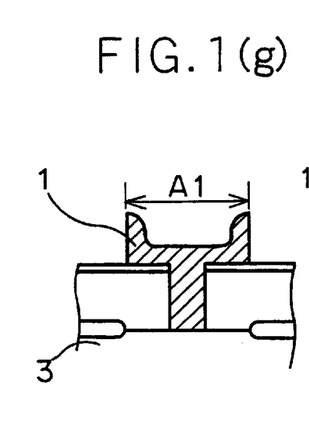

In FIGS. 1 and 2, FIGS. 1(a)–(g) on the left-hand side illustrate steps for manufacturing a cylindrical storage node 1 that is illustrated in FIG. 1(g) which is used as an example of a circuit element, whereas FIGS. 1(a′)–(g′) on the right-hand side illustrate the individual stages in the formation of a trough-like pattern 11 of an alignment mark 2 (FIG. 1(g′) in the first embodiment of the present invention that is produced concurrently during the formation of the storage node 1. It is to be noted that the steps for manufacturing the storage node 1 explained in reference to FIGS. 1(a)–(g) are essentially identical to those in the example of the prior art that has been explained in reference to FIGS. 5. In addition, while the alignment mark 2 is constituted by providing trough-like patterns 11–15 formed in a closed frame shape (in a rectangular frame) at a total of five locations as it will become clear through the explanation of FIG. 2, an explanation will be given on the trough-like pattern 11 as a typical example in reference to FIG. 1, since the individual trough-like patterns 11–15 are structured identically to each other.

At the location where the storage node 1 is to be produced at the surface of a semiconductor substrate (silicon wafer) 3, a first insulating film 23 constituted of silicon oxide and an etching block film 24 constituted of, for instance, silicon nitride are provided in advance in an active element area 22 partitioned by element separating areas 21, with a contact hole 25 passing through the insulating film 23 and the etching block film 24, as illustrated in FIG. 1(a). In addition, a second insulating film 26 constituted of silicon oxide or the like is formed on the etching block film 24 so that the contact hole 25 is filled with the second insulating film 26 and that the insulating film 23 and the etching block film 24, too, are covered by the second insulating film 26.

In addition, at the location where the alignment mark 2 is to be produced at the surface of the semiconductor substrate 3, too, a first insulating film 23′, an etching block film 24′ and a second insulating film 26′ are provided in advance, as illustrated in FIG. 1(a′). These films, i.e., the first insulating film 23′, the etching block film 24′ and the second insulating film 26′ are respectively constituted of the same materials as those constituting the first insulating film 23, the etching block film 24 and the second insulating film 26 illustrated in FIG. 1(a), and they are all formed through one and the same process.

Then, the second insulating films 26 and 26′ are first removed to achieve desired patterns through etching. Namely, at the location where the storage node 1 is to be produced, a pattern 1x of the storage node 1 is transferred onto a resist 27 provided at the surface of the second insulating film 26 and developed, which is then used as an etching mask to perform an isotropic etching on the second insulating film 26 in the vertical direction to remove the second insulating film 26 from an element area 26x that includes the area within the contact hole 25 indicated with the broken lines in FIG. 1(b), as illustrated in FIG. 1(b). In this case, if the circuit element is a cylindrical storage node 1 in a 256 megabit DRAM, for instance, the element area 26x is formed in a cylindrical shape having an internal diameter $A_1$ of approximately 0.4 micro-meter.

Concurrently with the process described above, at the location where the alignment mark 2 is to be produced, a pattern 11x for forming a trough-like pattern 11 is transferred onto a resist 27′ provided at the surface of the second insulating film 26′ and is developed as illustrated in FIG. 1(b′). (It is to be noted that when illustrated in cross section, as in FIG. 1(b′), a pair of patterns 11x and 11x for forming the trough-like pattern 11 are transferred and developed). Then, the pattern is used as an etching mask to perform an isotropic etching on the second insulating film 26′ in the vertical direction so that the second insulating film 26′ is removed from a pair of slit areas 26x′ and 26x′ indicated with the broken lines in FIG. 1(b′). It is to be noted that since the etching block films 24 and 24′ are present at both the locations where the storage node 1 is to be produced and where the alignment mark 2 is to be produced, neither of the first insulating films 23 and 23′ is etched.

Figure 2A:
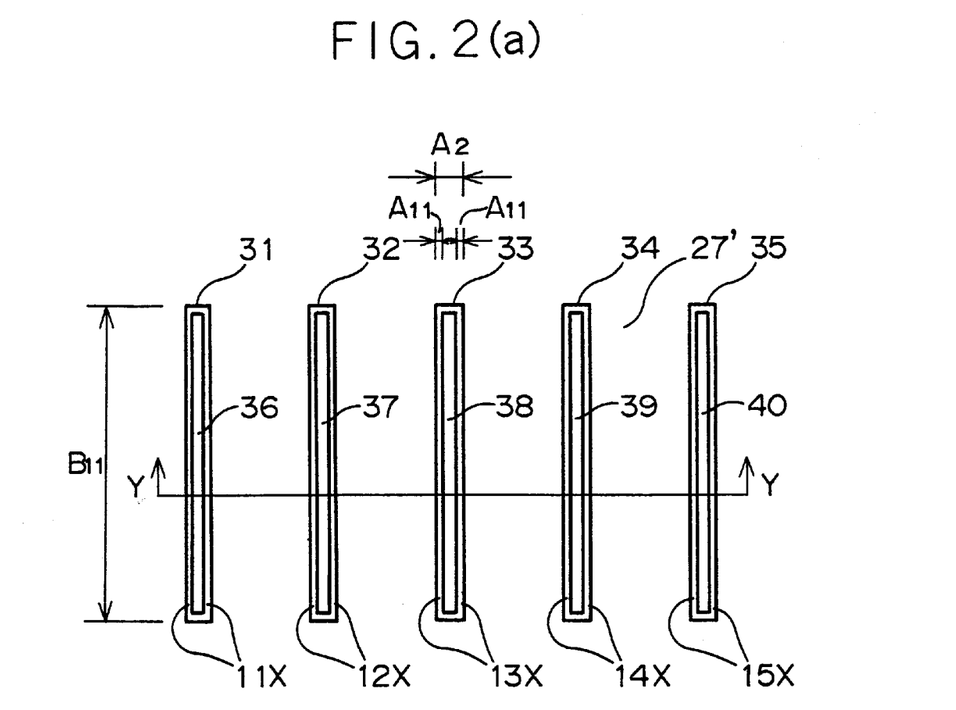
Figure 2B:
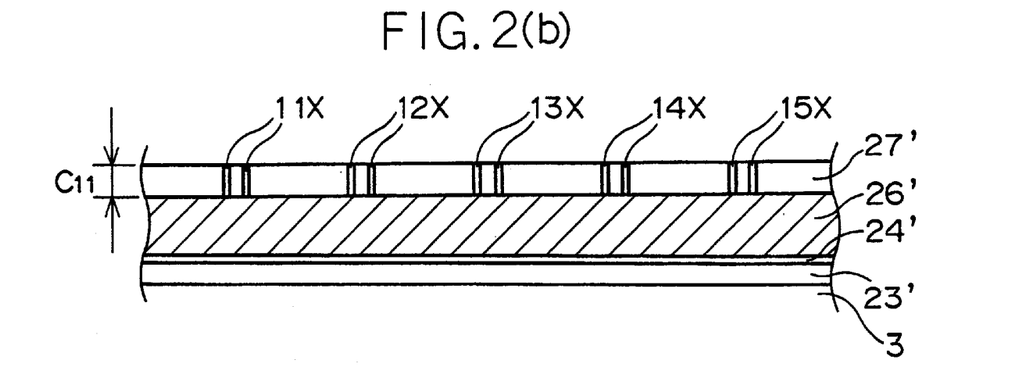

FIG. 2 illustrates individual patterns 11x–15x for forming the trough-like patterns 11–15 of the alignment mark 2 in the first embodiment of the present invention, with FIG. 2(a) presenting a plane view of the individual patterns 11x–15x and FIG. 2(b) presenting a cross section along line Y—Y in FIG. 2(a), viewed in the direction indicated by the arrows. It is to be noted that when illustrated as a cross section, as in FIG. 2(b), the individual patterns 11x–15x for forming the trough-like patterns 11–15 each emerge as a pair of patterns.

In the example illustrated in the figures, the patterns 11x–15x are constituted by providing a total of five indented portions 31–35 over specific intervals at the resist 27′ provided on the insulating film 26′ at the surface of the semiconductor substrate 3 and by forming island portions 36–40 that remain unetched at the centers of the indented portions 31–35 respectively. In addition, the rectangular patterns 11x–15x are formed in a circular shape between the inner walls of the indented portions 31–35 and the outer walls of the island portions 36–40 respectively. This structure ensures that the while width $A_2$ of the indented portions 31–35 is relatively large at approximately 4 micro-meter, the width $A_{11}$ of the individual patterns 11x–15x is essentially equal to the internal diameter A1 of the element area 26x for forming the storage node 1 explained earlier, at approximately 0.4 micro-meter. It is to be noted that the width of the island portions 36–40 is approximately 3.2 micro-meter. The length $B_{11}$ of the patterns 11x–15x is set at approximately 10 micro-meter or more in order to facilitate the scanning by increasing the length of the individual trough-like patterns 11, whereas the depth $C_{11}$ is set equal to the thickness of the insulating film, at approximately 0.1–5 micro-meter. With the second insulating film 26′ removed through etching by utilizing the patterns 11x and 11x having such a small width, the width of the slit area 26x′ and 26x′, too, can be set roughly equal to the internal diameter A1 of the element area 26x for the storage node 1 explained earlier at, approximately 0.4 micro-meter.

Next, a polysilicon film is formed over the entire surface of the semiconductor substrate 3. Namely, as illustrated in FIG. 1(c), at the location where the storage node 1 is to be produced, a polysilicon film 28 that constitutes a storage node material is formed. Concurrently with this, at the location where the alignment mark 2 is to be produced, too, a polysilicon film 28′ is formed, as illustrated in FIG. 1(c′).

Then, a third insulating film is formed over the entire surface of the semiconductor substrate 3. Namely, as illustrated in FIG. 1(d), at the location where the storage node 1 is to be produced, a third insulating film 29 constituted of silicon oxide or the like is formed on the polysilicon film 28. Since the width $A_1$ of the element area 26x is extremely small, at approximately 0.4 micro-meter at the most the location where the storage node 1 is to be produced, the surface of the third insulation film 29 constitutes an almost level surface so that the thickness $T_2$ of the third insulating film 29 at the element area 26x and the thickness $T_1$ of the insulating film 29 on the polysilicon film 28 in the other areas satisfy the relationship expressed as $T_1<T_2$.

At the same time, at the location where the alignment mark 2 is to be produced, too, a third insulating film 29' is formed on the polysilicon film 28', as illustrated in FIG. 1(d'). In this case, since the width of the patterns 11x and 11x is small and the width A11 of the slit areas 26x' is set at approximately 0.4 micro-meter essentially equaling the internal diameter A1of the element area 26x as has been explained earlier in reference to FIG. 2, the surface of the third insulating film 29' also constitutes an almost level surface at the location where the alignment mark 2 is to be produced. Thus, the thickness $T_2'$ of the third insulating film 29' in the vicinity of the centers of the slit areas 26x' and the thickness $T_1'$ of the third insulating film 29' on the polysilicon film 28' in the other areas, too, satisfy the relationship expressed as $T_1'<T_2'$.

Next, the third insulating films are etched back. Namely, at the location where the storage node 1 is to be produced, the third insulating film 29 is etched back until the surface of the piktsukucib fukn 28 is exposed, as illustrated in FIG. 1(e). Since the thickness $T_2$ of the third insulating film 29 at the element area 26x and the thickness $T_1$ of the insulating film 29 on the polysilicon film 28 in the other areas satisfy the relationship expressed as $T_1<T_2$ at the location where the storage node 1 is to be produced, the third insulating film 29 will remain unetched at an intended portion 28x formed at the polysilicon film 28 in correspondence to the element area 26x explained earlier.

Concurrently to the process described above, at the location where the alignment mark 2 is to be produced, too, the entire surface of the third insulating film 29' is etched back. In this case, since the thickness $T_2'$ of the third insulating film 29' in the vicinity of the centers of the slit areas 26x' and the thickness $T_1'$ of the insulating film 29' on the polysilicon film 28' in the other areas satisfy the relationship expressed as $T_1'<T_2'$, at the location where the alignment mark 2 is to be produced, too, the third insulating film 29' will remain unetched in a similar manner at an indented portions 28x' formed at the polysilicon film 28' in correspondence to the slit areas 26x'.

Next, the polysilicon is etched back. Namely, at the location where the storage node 1 is to be produced, since the third insulating film 29 is still present, the polysilicon film 28 will remain unremoved in the area that includes the indented portion 28x and the area inside the contact hole 25 even after the polysilicon film 28 is etched back, as illustrated in FIG. 1(f). At the same time, the polysilicon film 28' is etched back at the location where the alignment mark 2 is to be produced, and in this case, too, since the third insulating film 29' is still present at the indented portions 28x', the area that contains the indented portions 28x' remains unremoved, as illustrated in FIG. 1(f').

Then, the third insulating films and the second insulating films are removed using hydrofluoric acid or the like. Namely, as illustrated in FIG. 1(g), at the location where the storage node 1 is to be produced, a cylindrical storage node 1 constituted of polysilicon can be formed by removing the third insulating film 29 and the second insulating film 26 remaining at the indented portion 28x. The external diameter of the storage node 1 thus formed is approximately equal to the internal diameter $A_1$ of the element area 26x at approximately 0.4 micro-meter.

Concurrently, with this, as illustrated in FIG. 1(g'), a trough-like pattern 11 (emerges as a pair of trough-like patterns 11 and 11 in FIG. 1(g') that presents a cross section) having a width $A_{11}$ which is approximately equal to the external diameter of the storage node 1 at approximately 0.4 micro-meter is formed by removing the third insulating film 29' and the second insulating film 26' at the location where the alignment mark 2 is to be produced. It is to be noted that the length $B_{11}$ of the trough-like pattern 11 thus formed is approximately 10 micro-meter or more. In addition, the other trough-like patterns 12–15, too, are formed concurrently during the process in which the trough-like pattern 11 is formed, and they have the same size and the same shape as those of the trough-like patterns 11.

Thus, during the process in which the storage node 1 which is one of the circuit elements of the semiconductor element is produced, the trough-like patterns 11–15 are also formed so that the alignment mark 2 can be produced at the same time. As a result, the alignment mark 2 can be produced without having to implement a separate process so that a reduction in the overall number of manufacturing steps can be achieved compared to the method for manufacturing an alignment mark through a separate process, ultimately to achieve a reduction in the length of time for manufacturing the alignment mark and a reduction in production cost. The width of the alignment mark 2 thus produced is approximately equal to the external diameter of the storage node 1 as has been explained in reference to FIG. 1(g'), and consequently, a clear alignment mark 2 can be produced. In addition, since the individual trough-like patterns 11–15 of the alignment mark 2 thus produced and the semiconductor substrate 3 (the etching block film 24) come into contact with each other over a width of approximately 0.4 micro-meter, problems of the individual trough-like patterns 11–15 becoming collapsed or separated do not occur during subsequent substrate washing processes and the like. Thus, there is no risk of broken pieces of the alignment mark 2 that have become separated from the surface of the semiconductor substrate 3 scattering into the circuit area of the LSI is eliminated to ensure that a defect such as shorting of the circuit does not occur. Consequently, an LSI with a high product quality can be obtained.

Now, in FIG. 3, FIGS. 3(a)–(g) on the left-hand side illustrate steps for manufacturing a cylindrical storage node 5 which is an example of a circuit element and FIGS. 3(a')–(g') on the right-hand side illustrate the individual stages in the formation of a trough-like pattern 41 of an alignment mark 6 in the second embodiment of the present invention which is formed concurrently with the formation of the storage node 5, as in the previous embodiment. It is to be noted that as in the first embodiment, the trough-like pattern 41 is formed in a rounded rectangular shape in the second embodiment as well (note that in FIGS. 3(a')–(g'), which illustrate the manufacturing steps for the trough-like pattern 41 in cross section, too, the trough-like pattern 41, the pattern 41x and the like each emerge in pairs). A total of five trough-like patterns, i.e., the trough-like pattern 41 and trough-like patterns 42–45 which are structured identically to the trough-like pattern 41 (only their reference numbers are indicated in FIG. 3(f') for the trough-like patterns 42–45) constitute the alignment mark 6. It is to be noted that since the individual trough-like patterns 41–45 are all structured identically to one another, an explanation is given on the stages for producing a pair of trough-like patterns 41 as a typical example in reference to FIG. 3.

Figure 3:
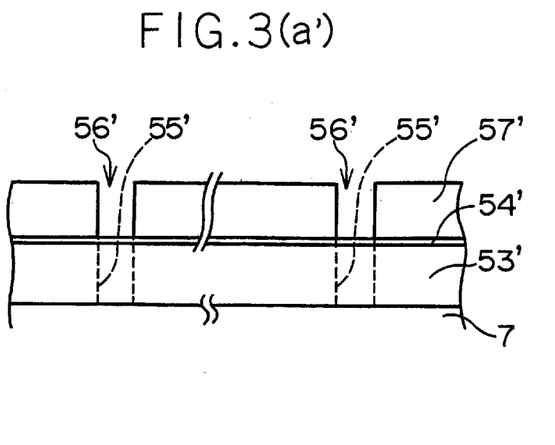
Figure 3A:
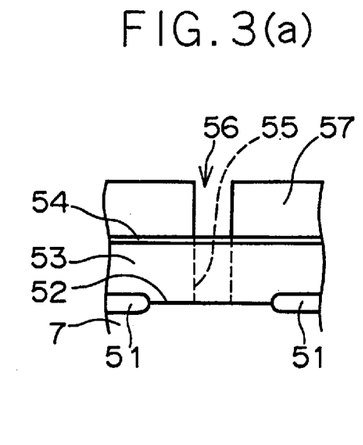

As illustrated in FIG. 3(a), at the location where the storage node 5 is to be produced at a surface of a semiconductor substrate (silicon wafer) 7, a first insulating film 53 constituted of silicon oxide and an etching block film 54 constituted of, for instance, silicon nitride are provided in advance at an active element area 52 partitioned by element separating areas 51, with a resist 57 having a pattern 56 of a contact hole 55 to be used for the connection with the active element area 52 provided on the etching block film 54. Then, an isotropic etching is performed on the etching block film 54 and the first insulating film 53 in the vertical direction in the figure by using the resist 57 as an etching mask to form the contact hole 55.

In addition, at the location where the alignment mark 6 is to be produced at the surface of the semiconductor substrate 7, too, a first insulating film 53' and an etching block film 54' are provided in advance with a resist 57' having a pattern 56' of a contact hole 55' to be used for the connection with the surface of the semiconductor substrate 7 provided on the etching block film 54', as illustrated in FIG. 3(a'). The first insulating film 53', the etching block film 54' and the resist 57' are constituted of the same materials as those constituting the first insulating film 53, the etching block film 54 and the resist 57 illustrated in FIG. 3(a) respectively, and they are respectively formed through the same steps (it is to be noted that at the location where the alignment mark 6 is to be produced, the pattern 56' for forming the trough-like patterns 41 and 41 emerges at two locations). Then, the process explained in reference to FIG. 3(a) is also implemented at this position simultaneously, in which an isotropic etching is performed on the etching block film 54' and the first insulating film 53' in the vertical direction in the figure with the resist 57' used as an etching mask to form contact holes 55' and 55'.

Figure 3B:
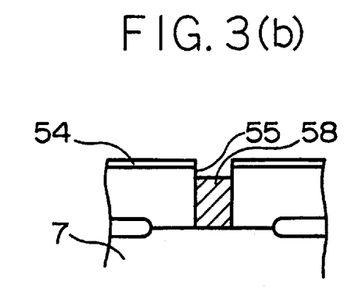

Next, a plug is formed inside the contact holes. Namely, at the location where the storage node 5 is to be produced, after the resist 57 is removed, a conductive film such as a polysilicon film is formed, and by etching back the entire surface, a polysilicon plug 58 is formed inside the contact hole 55, as illustrated in FIG. 3(b).

At the same time, at the location where the alignment mark 6 is to be produced, too, after the resist 57' is removed, a polysilicon film is formed, and through a subsequent etch-back, polysilicon plugs 58' and 58' are formed to constitute supporting portions inside the contact holes 55' and 55', as illustrated in FIG. 3(b').

Figure 3C:
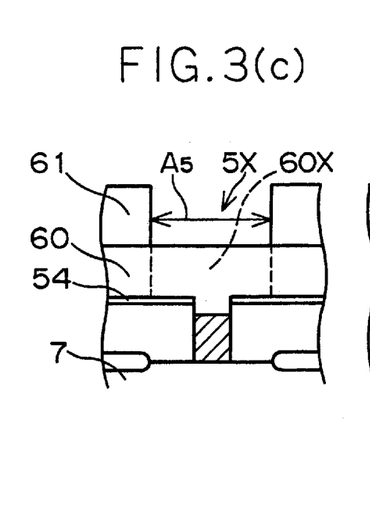

Then, a second insulating film is formed and etching is performed on it. Namely, at the location where the storage node 5 is to be produced, a second insulating film 60 constituted of, for instance, a silicon oxide, is formed on the etching block film 54 and then a pattern 5x of the storage node 5 is transferred onto a resist 61 provided on the second insulating film 60 and is developed, as illustrated in FIG. 3(c). If the circuit element is a cylindrical storage node 5 in a 256 megabit DRAM, for instance, the pattern 5x is formed in a cylindrical shape having an internal diameter $A_5$ of approximately 0.4 micro-meter. Then, an isotropic etching is performed on the second insulating film 60 in the vertical direction using the pattern 5x as an etching mask. Thus, the second insulating film 60 is removed from an element area 60x indicated with the broken lines in FIG. 3(c). It is to be noted that the first insulating film 53, which is covered by the etching block film 54, is not etched.

Concurrently with the process described above, at the location where the alignment mark 6 is to be produced, too, a second insulating film 60' is formed on the etching block film 54' and a resist 61' is provided on the second insulating film 60', as illustrated in FIG. 3(c'). Patterns 41x and 41x for forming the trough-like patterns 41 and 41 are transferred onto the resist 61' and developed. The width of the patterns 41x and 41x is set approximately equal to the internal diameter $A_5$ of the pattern 5x explained earlier at 0.4 micro-meter. After this, an isotropic etching is performed on the second insulating film 60 in the vertical direction to remove the second insulating film 60' from element areas 60x' indicated with the broken lines in FIG. 3(c').

Figure 3D:
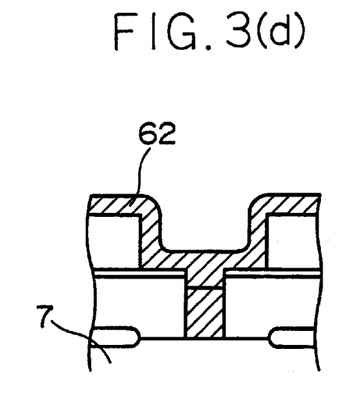

Next, after the resist 61 is removed, a film constituted of the storage node material, e.g., polysilicon, is formed over the entire surface of the semiconductor substrate 7. Namely, at the location where the storage node 5 is to be produced, a polysilicon film 62 to constitute the storage node is formed, as illustrated in FIG. 3(d). At the same time, at the location where the alignment mark 6 is to be produced, too, a polysilicon film 62' is formed, as illustrated in FIG. 3(d').

Figure 3E:
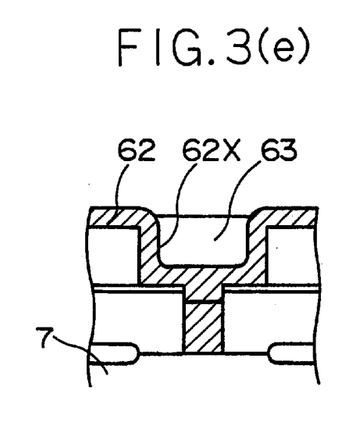

Then, at the location where the storage node 5 is to be produced, steps that are identical to those explained earlier in reference to FIGS. 1(d) and 1(e) are implemented to expose the surface of the polysilicon film 62, as illustrated in FIG. 3(e). Thus, a state in which a third insulating film 63 remains at an indented portion 62x formed at the polysilicon film 62 is achieved. Concurrently with this, at the location where the alignment mark 6 is to be produced, to, steps that are identical to those explained earlier in reference to FIGS. 1(d') and 1(e') are implemented to expose the surface of the polysilicon film 62', as illustrated in FIG. 3(e'). Thus, a state in which third insulating films 63' and 63' remain respectively at indented portions 62x' and 62x' formed at the polysilicon film 62' is achieved.

Figure 3F:
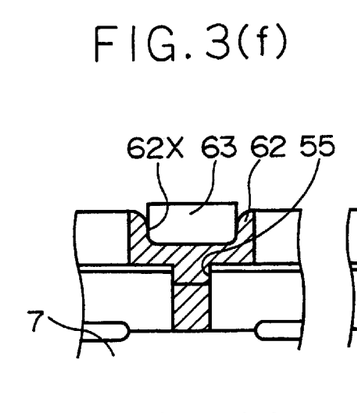

In the next step, the polysilicon is etched back. This process leaves the polysilicon film 62 unremoved in the area that includes the indented portion 62x and the area within the contact hole 55, as illustrated in FIG. 3(f) at the location where the storage node 5 is to be produced, and also leaves the polysilicon film 62' unremoved in the area including the indented portions 62x' and 62x' and the area inside the contact holes 55' and 55' as illustrated in FIG. 3(f') at the location where the alignment mark 6 is to be produced.

Figure 3G:
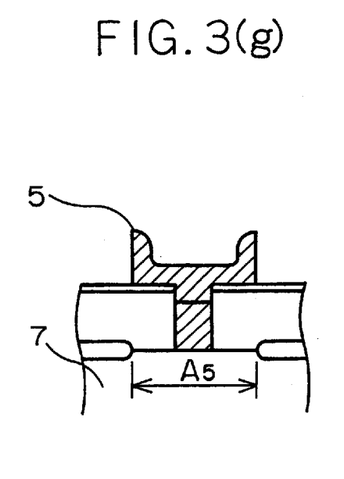

Then, the third insulating films and the second insulating films are removed with hydrofluoric acid or the like. Through this, as illustrated in FIG. 3(g), a cylindrical storage node 5 constituted of polysilicon is formed at the location where the storage node 5 is to be produced. The external diameter of the storage node 5 thus formed is approximately equal to the internal diameter $A_5$ of the pattern 5x at approximately 0.4 micro-meter.

At the same time, as illustrated in FIG. 3(g), a pair of trough-like patterns 41 and 41 having a width $A_{41}$ of approximately 0.4 micro-meter which is roughly equal to the external diameter of the storage node 5, are formed at the location where the alignment mark 6 is to be produced. It is to be noted that as in the first embodiment, the length $B_{41}$ of the trough-like patterns 41 thus formed is approximately 10 micro-meter or more. In addition, other trough-like patterns 42–45 (only the reference numbers are indicated for the trough-like patterns 42–45 in FIG. 3(g)) are formed concurrently with the formation of the trough-like patterns 41 to achieve the same size and the same shape as those of the trough-like patterns 41.

In addition to the same advantages achieved by the alignment mark 2 in the first embodiment explained earlier, the alignment mark 6 in the second embodiment achieves the following additional advantages. Namely, in the alignment mark 6 in the second embodiment, in addition to the width of the surfaces over which the individual trough-like patterns 41–45 come into contact with the semiconductor substrate 7 (the etching block film 54) set at approximately 0.4 micro-meter, the trough-like patterns 41–45 are even more firmly secured with the plugs 58' provided inside the insulating film 53 function as supporting portions. Consequently, problems such as the alignment mark 6 becoming collapsed or separated during subsequent substrate washing steps and the like can be even more reliably prevented. This also further reduces the risk of broken off pieces of the alignment mark 6 that have become separated from the surface of the semiconductor substrate 7 scattering into the circuit area of the LSI, thereby preventing defects such as shorting of the circuit. Thus, an LSI with an even higher degree of product quality is achieved.

While an explanation has been given on the alignment mark and the manufacturing method thereof in the preferred embodiments of the present invention by referring to the attached drawings, the present invention is not limited to these examples and it will be understood by those skilled in the art that various changes in form and detail may be made therein without departing from the spirit, scope and teaching of the invention.

For instance, while the explanation is given in reference to the first and second embodiments on examples in which the present invention is adopted in a mask and an alignment mark on a semiconductor substrate that are used during the exposure stage of the lithography process, the present invention may be adopted in a mark for measuring the relative positional error quantity (misalignment quantity) between an integrated circuit pattern constituted of a resist achieved through exposure and development and an integrated circuit pattern constituted on a base substrate by varying the form and size of the alignment mark. In addition, while an explanation has been given on examples in which a single cylinder shape storage node is manufactured in reference to the first and second embodiment, the present invention may be adopted when a storage node constituted by combining a plurality of cylinders is manufactured. Furthermore, while an explanation has been given on a case in which a storage node as one of the circuit elements of a semiconductor element is manufactured, the alignment mark according to the present invention may be adopted for a circuit element of a semiconductor element other than a storage node. Moreover, the individual trough-like patterns constituting the alignment mark may be each constituted by combining two narrow slits instead of in a closed frame form, and the number of slits is not limited to two and may be one, or three or more.

According to the present invention, since the alignment mark can be produced concurrently through the process for manufacturing a circuit element of a semiconductor element, it is not necessary to implement a separate process for producing the alignment mark to achieve a reduction in the overall number of manufacturing steps compared to a method in which the alignment mark is produced through a separate process. Thus, a reduction in the length of manufacturing time and a reduction in production cost are achieved. According to the present invention, a clear alignment mark having a width approximately equal to that of a circuit element is produced. In addition, the individual trough-like patterns of the alignment mark thus produced are free of the problems of becoming collapsed or separated during subsequent substrate washing steps and the like. Consequently, there is no risk of broken pieces of the alignment mark that have become separated from the surface of the semiconductor substrate being scattered into the circuit area of the LSI, to preclude defects such as shorting of the circuit. This makes it possible to achieve an LSI with a high degree of product quality. Moreover, by embedding supporting portions such as plugs within an insulating film at the surface of the semiconductor substrate, the trough-like patterns can be firmly mounted at the surface of the semiconductor substrate so that an alignment mark with even less risk of collapsing or separating can be provided.

The entire disclosure of Japanese Patent Application No. 9-21567 filed on Jul. 25, 1998 including specification, claims, drawings and summary is incorporated herein by reference in its entirety.

What is claimed is:

1. An alignment mark on a semiconductor substrate comprising:
   trough-like patterns having a width roughly equal to a circuit element provided at a surface of said semiconductor substrate.

2. The alignment mark on a semiconductor substrate according to claim 1, wherein said circuit element is a storage node.

3. The alignment mark on a semiconductor substrate according to claim 2, wherein said storage node is formed in a cylindrical shape.

4. The alignment mark on a semiconductor substrate according to claim 2, wherein a width of said trough-like patterns is set roughly equal to an external diameter of said storage node.

5. The alignment mark on a semiconductor substrate according to claim 2, wherein said trough-like patterns are constituted of a same material as that used to constitute said storage node.

6. The alignment mark of claim 2, wherein said storage node is applied to a DRAM.

7. The alignment mark on a semiconductor substrate according to claim 1, further comprising:
   supporting plugs embedded within an insulating film at said surface of said semiconductor substrate, said trough-like patterns being mounted on said supporting plugs at said surface of said semiconductor substrate.

8. The alignment mark of claim 7, wherein said supporting plugs are polysilicon.

9. The alignment mark of claim 1, wherein said trough-like patterns have a closed-frame shape.

10. The alignment mark of claim 9, wherein the closed-frame shape is rectangular.

11. The alignment mark of claim 1, wherein said trough-like patterns have a width of approximately 0.4 $\mu$m.

* * * * *